United States Patent
Lee

(10) Patent No.: US 12,185,629 B2
(45) Date of Patent: Dec. 31, 2024

(54) THERMOELECTRIC MODULE AND METHOD FOR MANUFACTURING THERMOELECTRIC MODULE

(71) Applicant: KELK Ltd., Kanagawa (JP)

(72) Inventor: Yonghoon Lee, Kanagawa (JP)

(73) Assignee: KELK Ltd., Kanagawa (JP)

( * ) Notice: Subject to any disclaimer, the term of this patent is extended or adjusted under 35 U.S.C. 154(b) by 0 days.

(21) Appl. No.: 17/625,055

(22) PCT Filed: May 28, 2020

(86) PCT No.: PCT/JP2020/021254
§ 371 (c)(1),
(2) Date: Jan. 5, 2022

(87) PCT Pub. No.: WO2021/019891
PCT Pub. Date: Feb. 4, 2021

(65) Prior Publication Data
US 2022/0293840 A1    Sep. 15, 2022

(30) Foreign Application Priority Data

Jul. 30, 2019   (JP) .................. 2019-140282

(51) Int. Cl.
*H10N 10/817* (2023.01)
*H10N 10/01* (2023.01)
*H10N 10/17* (2023.01)

(52) U.S. Cl.
CPC ........... *H10N 10/817* (2023.02); *H10N 10/01* (2023.02); *H10N 10/17* (2023.02)

(58) Field of Classification Search
CPC ....... H10N 10/817; H10N 10/17; H10N 10/01
See application file for complete search history.

(56) References Cited

U.S. PATENT DOCUMENTS

| | | |
|---|---|---|
| 6,172,294 B1 * | 1/2001 | Tsuno .................. H10N 10/817 136/203 |
| 6,410,840 B1 | 6/2002 | Sudo et al. |
| 2016/0181500 A1 | 6/2016 | Lin et al. |
| 2017/0250334 A1 | 8/2017 | Hermes et al. |
| 2019/0189887 A1 * | 6/2019 | Kwak .................. H10N 10/854 |

FOREIGN PATENT DOCUMENTS

| | | | | |
|---|---|---|---|---|
| CN | 107681044 A | * | 2/2018 | .......... H01L 35/325 |
| JP | H07-321378 A | | 12/1995 | |
| JP | H08-330638 A | | 12/1996 | |
| JP | 2001-068746 A | | 3/2001 | |
| JP | 2002124707 | | 4/2002 | |
| JP | 2002124707 A | * | 4/2002 | |
| JP | 2003-197981 A | | 7/2003 | |

(Continued)

OTHER PUBLICATIONS

Nakui, JP-2002124707-A, Machine Translation (Year: 2002).*

(Continued)

*Primary Examiner* — Devina Pillay
(74) *Attorney, Agent, or Firm* — Fish & Richardson P.C.

(57) ABSTRACT

A thermoelectric module includes a thermoelectric element disposed between a pair of electrodes, and an anchor layer disposed between the electrode and the thermoelectric element and connected with the thermoelectric element.

17 Claims, 4 Drawing Sheets

(56) References Cited

FOREIGN PATENT DOCUMENTS

| JP | 2007-227793 A | | 9/2007 |
|---|---|---|---|
| JP | 2007-535803 A | | 12/2007 |
| JP | 2013-089719 A | | 5/2013 |
| JP | 2016-119450 A | | 6/2016 |
| JP | 2017130596 | | 7/2017 |
| JP | 2017-204550 A | | 11/2017 |
| JP | 2017535939 | | 11/2017 |
| JP | 2018160560 | | 10/2018 |
| KR | 20160082366 A | * | 7/2016 |
| WO | WO 2005/074463 A2 | | 8/2005 |

OTHER PUBLICATIONS

Zhou, "Low interface resistance and excellent anti-oxidation of Al/Cu/Ni multilayer thin-film electrodes for Bi2Te3-based modules", Nano Energy 40 (2017) 274-281 (Year: 2017).*
KR20160082366A, Machine translation, Hwang (Year: 2016).*
CN-107681044-A, Machine translation, (Year: 2018).*
International Search Report in International Appln. No. PCT/JP2020/021254, dated Aug. 18, 2020, 2 pages.

* cited by examiner

THERMOELECTRIC MODULE AND METHOD FOR MANUFACTURING THERMOELECTRIC MODULE

CROSS-REFERENCE TO RELATED APPLICATIONS

This application is a National Stage application of International Application No. PCT/JP2020/021254, filed on May 28, 2020, which claims priority to Japanese Patent Application No. 2019-140282, filed on Jul. 30, 2019. The contents of the prior applications are incorporated herein in their entirety.

FIELD

The present invention relates to a thermoelectric module, and a method for manufacturing a thermoelectric module.

BACKGROUND

A thermoelectric module is manufactured by bonding a thermoelectric element and an electrode with a bonding layer interposed therebetween. Solder and a brazing material are known as materials for the bonding layer. As the brazing material, a silver brazing material containing silver (Ag) as a main component, a copper brazing material containing copper (Cu) as a main component, and an aluminum brazing material containing aluminum (Al) as a main component are known. The solder is used for bonding materials having low bonding temperatures (for example, lower than 450° C.). The brazing material is used for bonding materials having high bonding temperatures (for example, equal to or higher than 450° C.)

CITATION LIST

Patent Literature

Patent Literature 1: JP 2018-160560 A

SUMMARY

Technical Problem

In a case where a thermoelectric element and an electrode are bonded with each other with a bonding layer interposed therebetween, components of the bonding layer may be diffused into the thermoelectric element, or the electrode may get corroded due to a reaction with the bonding layer. Hence, there is a possibility that the performance of the thermoelectric module is degraded. For example, there is a possibility that bonding strength between the thermoelectric element and the bonding layer or bonding strength between the electrode and the bonding layer decreases, or electrical resistance or thermal resistance between the thermoelectric element and the electrode increases.

According to an aspect of the present invention, an object is to suppress a decrease in performance of a thermoelectric module.

Solution to Problem

According to an aspect of the present invention, a thermoelectric module comprises: a thermoelectric element disposed between a pair of electrodes; and an anchor layer disposed between the electrode and the thermoelectric element and connected with the thermoelectric element.

Advantageous Effects of Invention

According to an aspect of the present invention, a decrease in the performance of the thermoelectric module is suppressed.

DESCRIPTION OF EMBODIMENTS

Hereinafter, embodiments according to the present invention will be described with reference to the drawings, but the present invention is not limited to them. Components in a plurality of embodiments to be described below can be combined as appropriate. In addition, a part of the components is not used, in some cases.

First Embodiment

<Thermoelectric Module>

Figure 1:
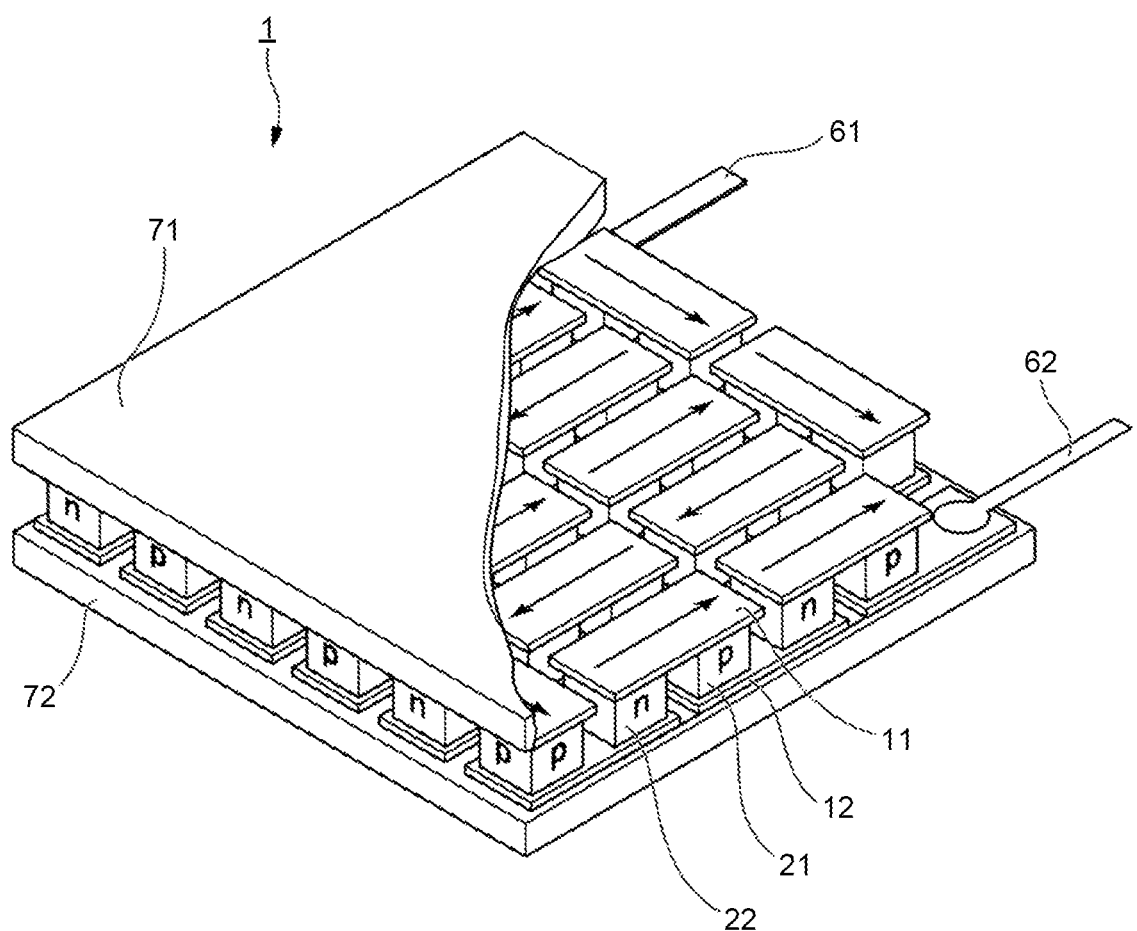
FIG. 1 is a perspective view illustrating a thermoelectric module according to a first embodiment.

FIG. 1 is a perspective view illustrating a thermoelectric module 1 according to the present embodiment. As illustrated in FIG. 1, a thermoelectric module 1 includes a pair of a substrate 71 and a substrate 72, a pair of an electrode 11 and an electrode 12, and a thermoelectric element 21 and a thermoelectric element 22 disposed between the electrode 11 and the electrode 12.

The substrate 71 and the substrate 72 are each formed of an electrically insulating material. The lower surface of the substrate 71 and the upper surface of the substrate 72 face each other with a gap interposed therebetween. In the present embodiment, the substrate 71 and the substrate 72 are each a ceramic substrate. The substrate 71 and the substrate 72 are each formed of oxide ceramic or nitride ceramic. As the oxide ceramic, aluminum oxide ($Al_2O_3$) or zirconium oxide ($ZrO_2$) is given as an example. As the nitride ceramic, silicon nitride ($Si_3N_4$) or aluminum nitride (AlN) is given as an example.

The electrode 11 is provided on the lower surface of the substrate 71. The electrode 12 is provided on the upper surface of the substrate 72. A plurality of electrodes 11 are provided in a predetermined plane parallel to the lower surface of the substrate 71. A plurality of electrodes 12 are provided in a predetermined plane parallel to the upper surface of the substrate 72.

The thermoelectric element 21 and thermoelectric element 22 are each made of a thermoelectric material. The thermoelectric element 21 is a p-type thermoelectric semiconductor element. The thermoelectric element 22 is an n-type thermoelectric semiconductor element. A plurality of thermoelectric elements 21 and a plurality of thermoelectric elements 22 are disposed in a predetermined plane. The thermoelectric element 21 and the thermoelectric element 22 are alternately disposed in a first axis direction in the predetermined plane. The thermoelectric element 21 and the thermoelectric element 22 are alternately disposed in a second axis direction in a predetermined plane orthogonal to the first axis direction.

The electrode 11 is connected with each pair of adjacent thermoelectric elements 21 and 22. The electrode 12 is connected with each pair of adjacent thermoelectric elements 21 and 22.

The thermoelectric element 21 and the thermoelectric element 22 are electrically connected with each other with the electrode 11 or the electrode 12 interposed therebetween to form a pn element pair. A plurality of pn element pairs are connected in series through the electrode 12 or the electrode 11, so a series circuit is configured. A lead wire 61 is connected with the thermoelectric element 22 at one end of the series circuit through the electrode 12. A lead wire 62 is connected with the thermoelectric element 21 at the other end of the series circuit through the electrode 12.

Electric current is supplied to the thermoelectric elements 21 and the thermoelectric elements 22, the thermoelectric module 1 absorbs heat or generates heat due to the Peltier effect. A temperature difference is given between the substrate 71 and the substrate 72, the thermoelectric module 1 generates electric power due to the Seebeck effect.

Figure 2:
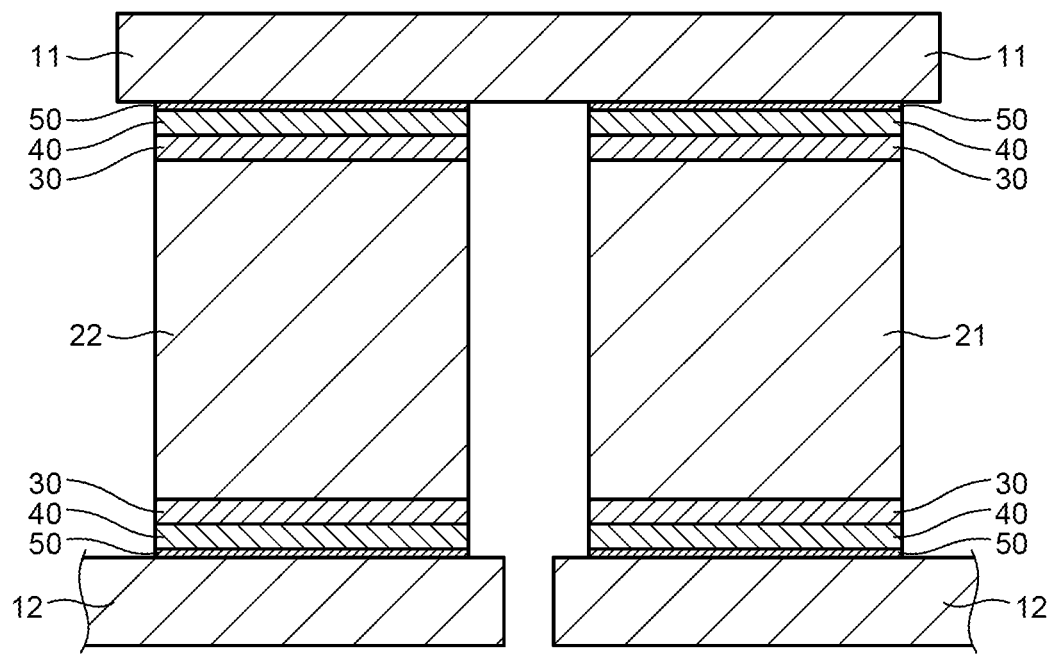
FIG. 2 is a cross-sectional view illustrating a part of the thermoelectric module according to the first embodiment.

FIG. 2 is a cross-sectional view illustrating a part of the thermoelectric module 1 according to the present embodiment. As illustrated in FIG. 2, the thermoelectric module 1 includes the thermoelectric element 21 disposed between a pair of the electrode 11 and the electrode 12, an anchor layer 30 disposed between the electrode 11 and the thermoelectric element 21 and connected with the thermoelectric element 21, a stress relieving layer 40 disposed between the anchor layer 30 and the electrode 11, and a eutectic layer 50 disposed between the stress relieving layer 40 and the electrode 11 and connected with the electrode 11.

The anchor layer 30, the stress relieving layer 40, and the eutectic layer 50 are disposed between the electrode 11 and the thermoelectric element 21, between the electrode 11 and the thermoelectric element 22, between the electrode 12 and the thermoelectric element 21, and between the electrode 12 and the thermoelectric element 22. The materials and the structures of the plurality of anchor layers 30 are the same. The materials and the structures of the plurality of stress relieving layers 40 are the same. The materials and the structures of the plurality of eutectic layers 50 are the same. In addition, the material of the electrode 11 and the material of the electrode 12 are the same. The material of the thermoelectric elements 21 and the material of the thermoelectric elements 22 are the same. In the following description, the anchor layer 30, the stress relieving layer 40, and the eutectic layer 50 disposed between the electrode 11 and the thermoelectric element 21 will be mainly described.

Figure 3:
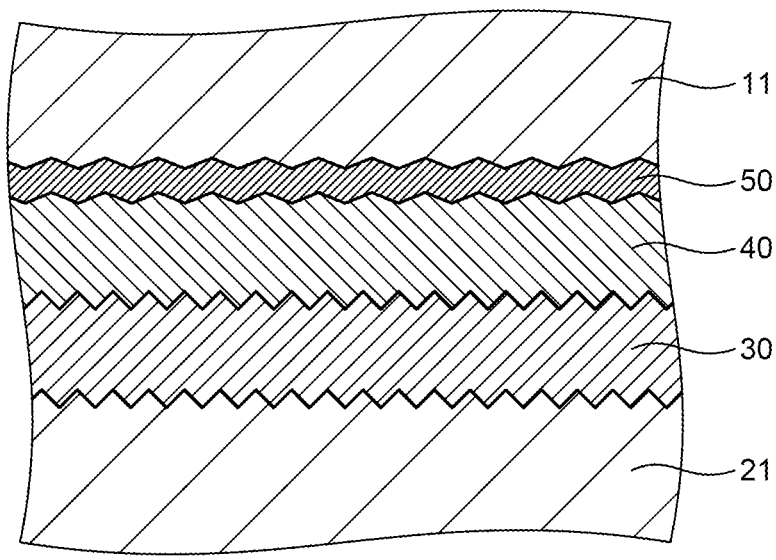
FIG. 3 is a partially enlarged cross-sectional view of the thermoelectric module according to the first embodiment.

FIG. 3 is a partially enlarged cross-sectional view of the thermoelectric module 1 according to the present embodiment. As illustrated in FIGS. 2 and 3, the anchor layer 30 is disposed on the upper side (on the electrode 11 side) of the thermoelectric element 21. The stress relieving layer 40 is disposed on the upper side (on the electrode 11 side) of the anchor layer 30. The eutectic layer 50 is disposed on the upper side (on the electrode 11 side) of the stress relieving layer 40. The electrode 11 is disposed on the upper side (on the electrode 11 side) of the eutectic layer 50.

The thermoelectric element 21 is made of a thermoelectric material. Examples of the thermoelectric material forming the thermoelectric element 21 include a manganese silicide-based compound (Mn—Si), a magnesium silicide-based compound (Mg—Si—Sn), a skutterudite-based compound (Co—Sb), a half-Heusler-based compound (Zr—Ni—Sn), and a bismuth tellurium-based compound (Bi—Te). The thermoelectric element 21 may be composed of one compound, or may be composed of a combination of at least two compounds selected from a manganese silicide-based compound, a magnesium silicide-based compound, a skutterudite-based compound, a half-Heusler-based compound, and a bismuth tellurium-based compound.

The anchor layer 30 joins the thermoelectric element 21 and the electrode 11 (the stress relieving layer 40) with high joining strength due to an anchor effect.

The anchor layer 30 is made of molybdenum (Mo). Note that the anchor layer 30 may be made of nickel (Ni) or titanium (Ti). The anchor layer 30 may be composed of a combination of at least two materials selected from molybdenum, nickel, and titanium.

One surface of the anchor layer 30 is in contact with the thermoelectric element 21. One surface of the anchor layer 30 includes an uneven portion. The uneven portion on one surface of the anchor layer 30 bites into the thermoelectric element 21. The anchor effect of the uneven portion on one surface of the anchor layer 30 improves adhesive strength between the anchor layer 30 and the thermoelectric element 21. In the present embodiment, the tensile strength between the thermoelectric element 21 and the anchor layer 30 is equal to or more than 60 [kgf/cm$^2$]. The stress relieving layer 40 relieves a stress acting on the thermoelectric element 21 or the electrode 11. The stress relieving layer 40 is softer than the anchor layer 30. Even when a thermal stress acts on the thermoelectric element 21, the anchor layer 30, or the electrode 11, at least a part of the stress relieving layer 40 is deformed to relieve the thermal stress acting on the thermoelectric element 21, the anchor layer 30, or the electrode 11.

The stress relieving layer 40 is made of copper (Cu). Note that the stress relieving layer 40 may be made of an alloy containing copper, aluminum (Al), an alloy containing aluminum, nickel (Ni), or an alloy containing nickel. Note that in a case where the anchor layer 30 is made of nickel, the stress relieving layer 40 is preferably made of a material other than nickel. Note that the stress relieving layer 40 may be formed of a combination of at least two materials selected from copper, aluminum, and nickel.

The other surface of the anchor layer 30 is in contact with one surface of the stress relieving layer 40. The other surface of the anchor layer 30 includes an uneven portion. The uneven portion on the other surface of the anchor layer 30 bites into the stress relieving layer 40. The anchor effect of the uneven portion on the other surface of the anchor layer 30 improves adhesive strength between the anchor layer 30 and the stress relieving layer 40. In the present embodiment, the tensile strength between the anchor layer 30 and the stress relieving layer 40 is equal to or more than 60 [kgf/cm$^2$].

The eutectic layer 50 is generated by a eutectic reaction between the stress relieving layer 40 and the electrode 11. The eutectic layer 50 contains crystals of the stress relieving layer 40 and the electrode 11. The eutectic layer 50 is disposed between the other surface of the stress relieving layer 40 and one surface of the electrode 11. The eutectic layer 50 is generated by pressure-welding the stress relieving layer 40 and the electrode 11 in a heated state. The eutectic layer 50 improves adhesive strength between the stress relieving layer 40 and the electrode 11. In the present embodiment, the tensile strength between the stress relieving layer 40 and the electrode 11 is equal to or more than 60 [kgf/cm$^2$].

The electrode 11 is made of a single material. In the present embodiment, the electrode 11 is made of aluminum (Al). Note that the electrode 11 may be made of an alloy containing aluminum. The electrode 11 may be made of copper (Cu), an alloy containing copper, nickel (Ni), or an alloy containing nickel.

<Electrode>

Figure 4:
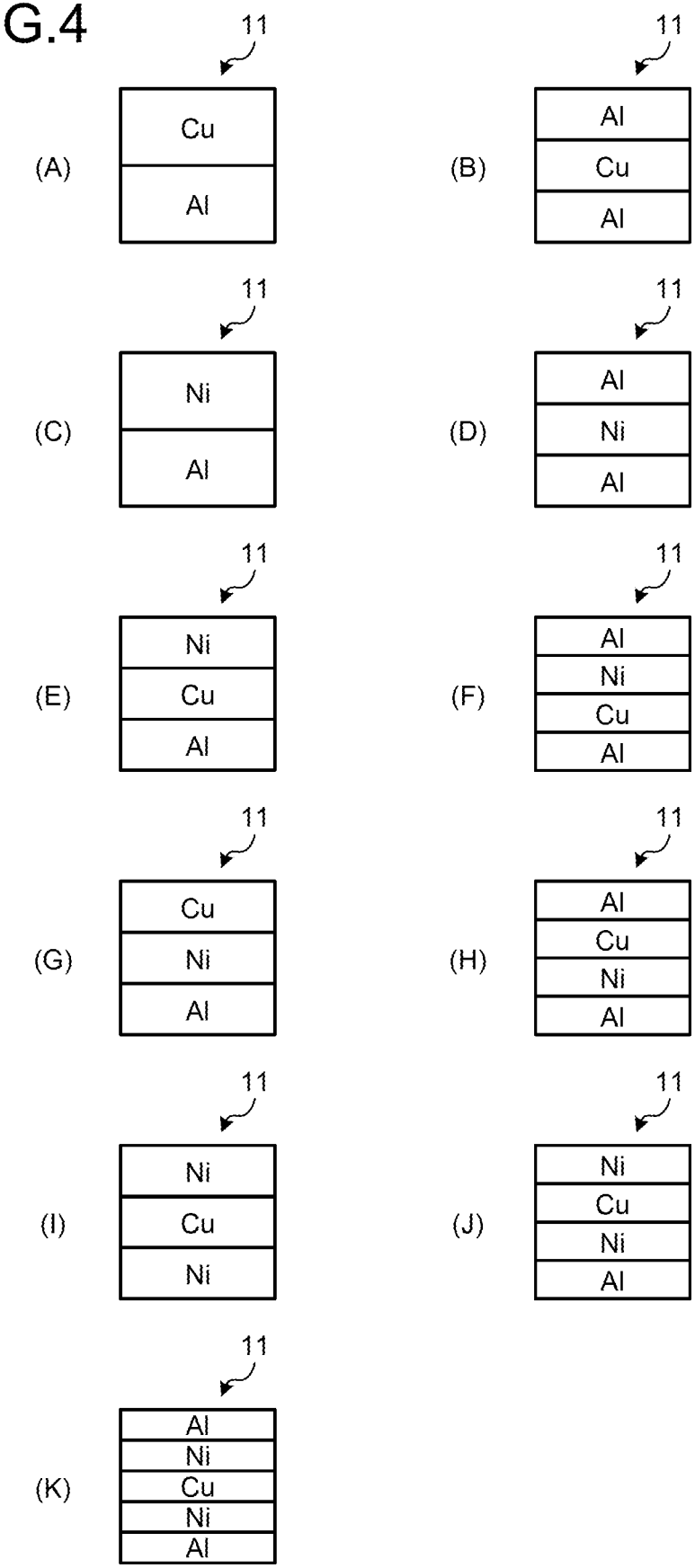
FIG. 4 is a view schematically illustrating an electrode according to the first embodiment.

FIG. 4 is a view schematically illustrating the electrode 11 according to the present embodiment. As illustrated in FIG. 4, the electrode 11 may be made of different materials.

As illustrated in FIG. 4(A), the electrode 11 may be configured with a first electrode layer made of aluminum (Al) or an alloy containing aluminum, and a second electrode layer made of copper (Cu) or an alloy containing copper. In the example illustrated in FIG. 4(A), the first electrode layer is connected with the stress relieving layer 40 with the eutectic layer 50 interposed therebetween, and the second electrode layer is connected with the substrate 71.

As illustrated in FIG. 4(B), the electrode 11 may be configured with the first electrode layer made of aluminum (Al) or an alloy containing aluminum, the second electrode layer made of copper (Cu) or an alloy containing copper, and a third electrode layer made of aluminum (Al) or an alloy containing aluminum. In the example illustrated in FIG. 4(B), the first electrode layer is connected with the stress relieving layer 40 with the eutectic layer 50 interposed therebetween, and the third electrode layer is connected with the substrate 71.

As illustrated in FIG. 4(C), the electrode 11 may be configured with the first electrode layer made of aluminum (Al) or an alloy containing aluminum, and the second electrode layer made of nickel (Ni) or an alloy containing nickel. In the example illustrated in FIG. 4(C), the first electrode layer is connected with the stress relieving layer 40 with the eutectic layer 50 interposed therebetween, and the second electrode layer is connected with the substrate 71.

As illustrated in FIG. 4(D), the electrode 11 may be configured with the first electrode layer made of aluminum (Al) or an alloy containing aluminum, the second electrode layer made of nickel (Ni) or an alloy containing nickel, and the third electrode layer made of aluminum (Al) or an alloy containing aluminum. In the example illustrated in FIG. 4(D), the first electrode layer is connected with the stress relieving layer 40 with the eutectic layer 50 interposed therebetween, and the third electrode layer is connected with the substrate 71.

As illustrated in FIG. 4(E), the electrode 11 may be configured with the first electrode layer made of aluminum (Al) or an alloy containing aluminum, the second electrode layer made of copper (Cu) or an alloy containing copper, and the third electrode layer made of nickel (Ni) or an alloy containing nickel. In the example illustrated in FIG. 4(E), the first electrode layer is connected with the stress relieving layer 40 with the eutectic layer 50 interposed therebetween, and the third electrode layer is connected with the substrate 71.

As illustrated in FIG. 4(F), the electrode 11 may be configured with the first electrode layer made of aluminum (Al) or an alloy containing aluminum, the second electrode layer made of copper (Cu) or an alloy containing copper, the third electrode layer made of nickel (Ni) or an alloy containing nickel, and a fourth electrode layer made of aluminum (Al) or an alloy containing aluminum. In the example illustrated in FIG. 4(F), the first electrode layer is connected with the stress relieving layer 40 with the eutectic layer 50 interposed therebetween, and the fourth electrode layer is connected with the substrate 71.

As illustrated in FIG. 4(G), the electrode 11 may be configured with the first electrode layer made of aluminum (Al) or an alloy containing aluminum, the second electrode layer made of nickel (Ni) or an alloy containing nickel, and the third electrode layer made of copper (Cu) or an alloy containing copper. In the example illustrated in FIG. 4(G), the first electrode layer is connected with the stress relieving layer 40 with the eutectic layer 50 interposed therebetween, and the third electrode layer is connected with the substrate 71.

As illustrated in FIG. 4(H), the electrode 11 may be configured with the first electrode layer made of aluminum (Al) or an alloy containing aluminum, the second electrode layer made of nickel (Ni) or an alloy containing nickel, the third electrode layer made of copper (Cu) or an alloy containing copper, and the fourth electrode layer made of aluminum (Al) or an alloy containing aluminum. In the example illustrated in FIG. 4(H), the first electrode layer is connected with the stress relieving layer 40 with the eutectic layer 50 interposed therebetween, and the fourth electrode layer is connected with the substrate 71.

As illustrated in FIG. 4(I), the electrode 11 may be configured with the first electrode layer made of nickel (Ni) or an alloy containing nickel, the second electrode layer made of copper (Cu) or an alloy containing copper, and the third electrode layer made of nickel (Ni) or an alloy containing nickel. In the example illustrated in FIG. 4(I), the first electrode layer is connected with the stress relieving layer 40 with the eutectic layer 50 interposed therebetween, and the third electrode layer is connected with the substrate 71.

As illustrated in FIG. 4(J), the electrode 11 may be configured with the first electrode layer made of nickel (Ni) or an alloy containing nickel, the second electrode layer made of copper (Cu) or an alloy containing copper, the third electrode layer made of nickel (Ni) or an alloy containing nickel, and the fourth electrode layer made of aluminum (Al) or an alloy containing aluminum. In the example illustrated in FIG. 4(J), the first electrode layer is connected with the stress relieving layer 40 with the eutectic layer 50 interposed therebetween, and the fourth electrode layer is connected with the substrate 71.

As illustrated in FIG. 4(K), the electrode 11 may be configured with the first electrode layer made of aluminum (Al) or an alloy containing aluminum, the second electrode layer made of nickel (Ni) or an alloy containing nickel, the third electrode layer made of copper (Cu) or an alloy containing copper, the fourth electrode layer made of nickel (Ni) or an alloy containing nickel, and a fifth electrode layer made of aluminum (Al) or an alloy containing aluminum. In the example illustrated in FIG. 4(K), the first electrode layer is connected with the stress relieving layer 40 with the eutectic layer 50 interposed therebetween, and the fifth electrode layer is connected with the substrate 71.

<Manufacturing Method>

Figure 5:
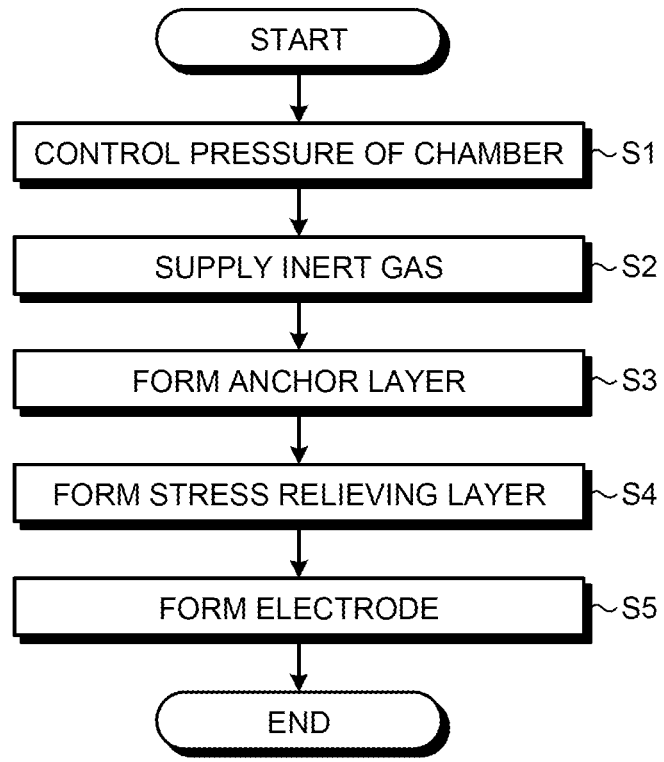
FIG. 5 is a flowchart illustrating a method for manufacturing the thermoelectric module according to the first embodiment.

FIG. 5 is a flowchart illustrating a manufacturing method of the thermoelectric module 1 according to the present embodiment. In the present embodiment, the thermoelectric module 1 is manufactured by thermal spraying in an oxygen-free atmosphere in which the oxygen concentration is sufficiently reduced.

The thermal spraying refers to a processing method for spraying a thermal spray material in a molten state or a semi-molten state onto the base material to form a film on a surface of a base material. The thermal spray material is sprayed onto the base material in the form of droplets.

The internal space of a chamber in which the thermoelectric elements 21 are disposed is controlled to a certain pressure (step S1).

That is, the internal space of the chamber is made into vacuum, in a state where the thermoelectric elements 21 are disposed in the internal space of the chamber.

After the internal space of the chamber is controlled to a certain pressure, an inert gas is supplied to the internal space of the chamber (step S2).

As the inert gas, nitrogen gas or argon gas is given as an example.

By the processes of step S1 and step S2, the internal section of the chamber is adjusted to the oxygen-free atmosphere.

In the oxygen-free atmosphere, the anchor layer 30 is formed on the thermoelectric elements 21 by the thermal spraying (step S3).

While the anchor layer 30 is being formed by the thermal spraying, the thermoelectric elements 21 function as base materials, and the material forming the anchor layer 30 functions as a thermal spray material. In the present embodiment, the thermal spray material made of molybdenum (Mo) is sprayed onto the thermoelectric elements 21. The anchor layer 30 is formed by the thermal spraying. Accordingly, as described with reference to FIG. 3, the anchor layer 30 is formed such that the anchor layer 30 partially bites into the thermoelectric elements 21. Further, the anchor layer 30 is formed by the thermal spraying, and thus the uneven portion is formed on the other surface of the anchor layer 30.

The surface roughness of the thermoelectric element 21 is 1.1 μm±0.2 μm. The anchor layer 30 formed on the surface of the thermoelectric element 21 has surface roughness Ra≥3 μm (Sa≥3 μm). Note that the surface roughness Ra refers to arithmetic average roughness of the anchor layer 30 in the cross-section. That is, the surface roughness Ra denotes arithmetic average roughness of a case where the surface of the anchor layer 30 is represented by a line. Surface roughness Sa refers to arithmetic average roughness of a case where the surface roughness Ra is extended to a plane.

As illustrated in FIG. 1, the thermoelectric module 1 has a structure in which the plurality of thermoelectric elements 21 are disposed between the substrate 71 and the substrate 72. In a case where the heights of the plurality of thermoelectric elements 21 are not uniform, there is a possibility that a yield decreases. An upper limit value of the surface roughness of the anchor layer 30 is 12 μm in order to suppress a decrease in yield caused by the non-uniform heights of the plurality of thermoelectric elements 21.

In the present embodiment, the thickness of the anchor layer 30 is approximately 50 μm.

After the anchor layer 30 is formed on the thermoelectric elements 21, the stress relieving layer 40 is formed on the anchor layer 30 (step S4). The stress relieving layer 40 is formed on the anchor layer 30 by the thermal spraying in the oxygen-free atmosphere. The stress relieving layer 40 may be formed by, for example, a sputtering method or a vapor deposition method. The uneven portion is formed on the other surface of the anchor layer 30, and thus the stress relieving layer 40 is formed to be bitten into by the anchor layer 30 partially, as described with reference to FIG. 3. The surface roughness of the stress relieving layer 40 is Ra≥3 μm (Sa≥3 μm).

In the present embodiment, the thickness of the stress relieving layer 40 is approximately 50 μm.

After the stress relieving layer 40 is formed on the anchor layer 30, the electrode 11 is formed on the stress relieving layer 40 (step S5).

In a case where the electrode 11 is formed by the thermal spraying, the surface roughness of the electrode 11 is Ra≥3 μm (Sa≥3 μm).

The electrode 11 is formed on the stress relieving layer 40 by the thermal spraying in the oxygen-free atmosphere. The electrode 11 may be formed by, for example, a sputtering method or a vapor deposition method. After the electrode 11 is formed, the stress relieving layer 40 and the electrode 11 are brought into pressure-welded with each other in a heated state, and thus the eutectic layer 50 is generated. The magnitude of the pressure-welding is 1 MPa or more. In addition, the eutectic layer 50 may be formed on at least a part of an interface between the anchor layer 30 and the stress relieving layer 40 or at least a part of an interface between the anchor layer 30 and the electrode 11.

Advantageous Effect

As described heretofore, according to the present embodiment, the bonding layer made of solder or a brazing material is omitted. The thermoelectric element 21 and the electrode 11 are bonded with each other with the anchor layer 30 and stress relieving layer 40 interposed therebetween. The bonding layer is omitted, and thus components of the bonding layer do not diffuse into the thermoelectric elements 21, or the electrode 11 does not get corroded due to the bonding layer. Therefore, degradation in the performance of the thermoelectric module 1 is suppressed.

In addition, the bonding layer is omitted, and the components of the bonding layer do not diffuse into the thermoelectric element 21 or the electrode 11 does not get corroded due to the bonding layer. Therefore, the electrical resistance and the thermal resistance between the thermoelectric elements 21 and the electrode 11 are reduced as compared with the case where the bonding layer is present. Accordingly, a power generation amount of the thermoelectric module 1 with the Seebeck effect increases, and a heat absorption amount or a heat generation amount of the thermoelectric module 1 with the Peltier effect increases. That is, the performance of the thermoelectric module 1 is improved.

In addition, the bonding layer is omitted, and thus the process of forming the bonding layer is omitted. Therefore, a bonding device that uses the bonding layer is no longer necessary, and the manufacturing process of the thermoelectric module 1 is simplified. In addition, the bonding layer is omitted, and thus the manufacturing cost is reduced.

The uneven portion is provided on one surface of the anchor layer 30 in contact with the thermoelectric elements 21. Accordingly, the thermoelectric elements 21 and the anchor layer 30 are firmly connected with each other by the anchor effect. In addition, the anchor layer 30 is made of molybdenum (Mo), nickel (Ni), or titanium (Ti). These materials are high in melting point and low in reactivity. Such characteristics suppress the components of the anchor layer 30 from diffusing into the thermoelectric elements 21, and suppress the anchor layer 30 from changing the characteristic of the thermoelectric elements 21.

For example, in a case where the thermoelectric elements 21 are formed of a thermoelectric material that produces the best thermoelectric effect at a high temperature (for example, 450° C. or higher), there is a possibility that the components of the anchor layer 30 diffuse into the thermoelectric elements 21 depending on the material of the anchor layer 30, when the anchor layer 30 is used at a high temperature. In the present embodiment, the anchor layer 30 is made of molybdenum (Mo), nickel (Ni), or titanium (Ti). Therefore, even when the anchor layer 30 is used at a high temperature, the components of the anchor layer 30 are suppressed from diffusing into the thermoelectric elements 21.

The uneven portion is provided on the other surface of the anchor layer 30 in contact with the stress relieving layer 40. Accordingly, the stress relieving layer 40 and the anchor layer 30 are firmly connected with each other by the anchor effect.

The provision of the stress relieving layer 40, which is softer than the anchor layer 30, relieves the thermal stress acting on the thermoelectric elements 21, the anchor layer 30, or the electrode 11, because at least a part of the stress relieving layer 40 is deformed, even when the thermal stress acts on the thermoelectric elements 21, the anchor layer 30, or the electrode 11.

The stress relieving layer 40 is made of copper (Cu), an alloy containing copper, aluminum (Al), an alloy containing aluminum, nickel (Ni), or an alloy containing nickel. These materials are low in the electrical resistance and the thermal resistance. Such characteristics suppress increases in the electrical resistance and the thermal resistance between the thermoelectric elements 21 and the electrode 11. Accordingly, degradation in the performance of the thermoelectric module 1 is suppressed.

The eutectic layer 50 is provided between the stress relieving layer 40 and the electrode 11. The eutectic layer 50 improves adhesive strength between the stress relieving layer 40 and the electrode 11. In addition, the eutectic layer 50 suppresses the formation of an interface between the stress relieving layer 40 and the electrode 11, and thus suppresses the increases in the electrical resistance and the thermal resistance between the stress relieving layer 40 and the electrode 11.

Second Embodiment

A second embodiment will be described. In the following description, the same or equivalent components as those in the above-described embodiment are designated by the same reference numerals, and the descriptions thereof will be simplified or omitted.

Figure 6:
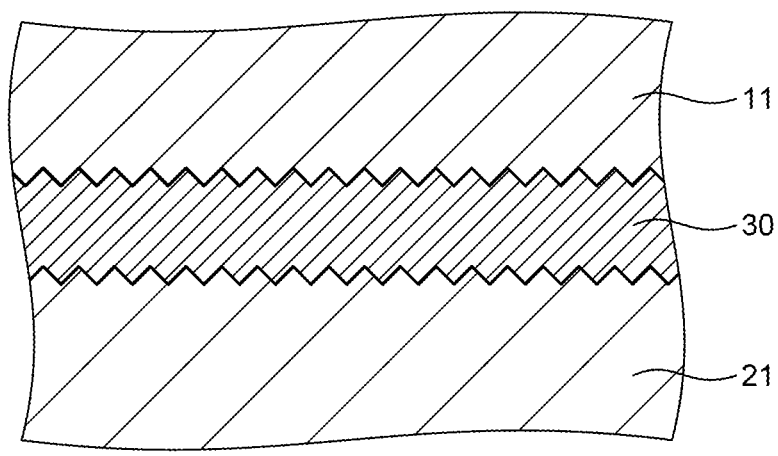
FIG. 6 is a partially enlarged cross-sectional view of a thermoelectric module according to a second embodiment.

FIG. 6 is a partially enlarged cross-sectional view of the thermoelectric module 1 according to the present embodiment. As illustrated in FIG. 6, the thermoelectric module 1 includes the anchor layer 30, which is disposed between the electrode 11 and the thermoelectric elements 21, and which is connected with thermoelectric elements 21. In the present embodiment, the stress relieving layer 40 and the eutectic layer 50 are omitted.

One surface of the anchor layer 30 is in contact with the thermoelectric element 21. An uneven portion is provided on one surface of the anchor layer 30. The anchor layer 30 partially bites into the thermoelectric elements 21. The anchor layer 30 and the thermoelectric elements 21 are firmly connected with each other by the anchor effect of the uneven portion provided on one surface of the anchor layer 30. The tensile strength between the thermoelectric element 21 and the anchor layer 30 is equal to or more than 60 [kgf/cm$^2$].

The other surface of the anchor layer 30 is in contact with the electrode 11. An uneven portion is provided on the other surface of the anchor layer 30. The anchor layer 30 partially bites into the electrode 11. The anchor layer 30 and the electrode 11 are firmly connected with each other by the anchor effect of the uneven portion provided on the other surface of the anchor layer 30. The tensile strength between the electrode 11 and the anchor layer 30 is equal to or more than 60 [kgf/cm$^2$].

The anchor layer 30 is formed on the thermoelectric element 21 by thermal spraying in an oxygen-free atmosphere. The anchor layer 30 is formed by the thermal spraying. Accordingly, the anchor layer 30 is formed such that the anchor layer 30 partially bites into the thermoelectric elements 21. Further, the anchor layer 30 is formed by the thermal spraying, and thus the uneven portion is formed on the other surface of the anchor layer 30.

After the anchor layer 30 is formed on the thermoelectric elements 21, the electrode 11 is formed on the anchor layer 30. The electrode 11 is formed on the anchor layer 30 by the thermal spraying in the oxygen-free atmosphere. The electrode 11 may be formed by, for example, a sputtering method or a vapor deposition method. The uneven portion is formed on the other surface of the anchor layer 30, and thus the electrode 11 is formed to be bitten into by the anchor layer 30 partially.

Note that as described in the above embodiment, the electrode 11 may be formed of a single material, or may be configured with a plurality of electrode layers, as described with reference to FIG. 4.

As described heretofore, in the present embodiment, the thermoelectric elements 21 and the electrode 11 are bonded with each other with the anchor layer 30 interposed therebetween, in a state where the bonding layer is omitted. The bonding layer is omitted, and thus a decrease in performance of the thermoelectric module 1 is suppressed.

In the present embodiment, not only the bonding layer but also the stress relieving layer 40 are omitted, so the manufacturing process of the thermoelectric module 1 is further simplified, and the manufacturing cost is further reduced.

The uneven portion is provided on one surface of the anchor layer 30 in contact with the thermoelectric elements 21. Accordingly, the thermoelectric elements 21 and the anchor layer 30 are firmly connected with each other by the anchor effect. Further, the uneven portion is provided on the other surface of the anchor layer 30 in contact with the electrode 11. Accordingly, the electrode 11 and the anchor layer 30 are more firmly connected by the anchor effect.

The invention claimed is:

1. A thermoelectric module comprising:
   a thermoelectric element disposed between a pair of electrodes;
   an anchor layer connected with thermoelectric element and disposed between the thermoelectric element and an electrode among the pair of electrodes;
   a stress relieving layer disposed between the anchor layer and the electrode; and
   a eutectic layer disposed between the stress relieving layer and the electrode,
   wherein the eutectic layer is generated between the stress relieving layer and the electrode by a eutectic reaction between the stress relieving layer and the electrode without a solder material therebetween, the eutectic layer being made of (i) copper (Cu) and aluminum (Al)

or an alloy containing Cu and Al, (ii) nickel (Ni) and Al or an alloy containing Ni and Al, or (iii) Cu and Ni or an alloy containing Cu and Ni, and wherein the anchor layer includes an uneven portion defined at each of (i) a first surface in direct contact with the thermoelectric element and (ii) a second surface in direct contact with the stress relieving layer.

2. The thermoelectric module according to claim 1, wherein the thermoelectric element includes at least one of a manganese silicide-based compound (Mn—Si), a magnesium silicide-based compound (Mg—Si—Sn), a skutterudite-based compound (Co—Sb), a half-Heusler-based compound (Zr—Ni—Sn), or a bismuth tellurium-based compound (Bi—Te).

3. The thermoelectric module according to claim 1, wherein the electrode includes a first electrode layer made of aluminum (Al) or an alloy containing aluminum, and a second electrode layer made of copper (Cu) or an alloy containing copper.

4. The thermoelectric module according to claim 1, wherein the anchor layer is made of molybdenum (Mo), nickel (Ni), or titanium (Ti).

5. The thermoelectric module according to claim 1, wherein tensile strength between the thermoelectric element and the anchor layer is equal to or more than 60 [kgf/cm$^2$].

6. The thermoelectric module according to claim 1, wherein the stress relieving layer is softer than the anchor layer.

7. The thermoelectric module according to claim 1, wherein the stress relieving layer is made of copper (Cu), an alloy containing copper, aluminum (Al), an alloy containing aluminum, nickel (Ni), or an alloy containing nickel.

8. The thermoelectric module according to claim 1, wherein tensile strength between the anchor layer and the stress relieving layer is equal to or more than 60 [kgf/cm$^2$].

9. The thermoelectric module according to claim 1, wherein tensile strength between the stress relieving layer and the electrode is equal to or more than 60 [kgf/cm$^2$].

10. The thermoelectric module according to claim 1, wherein the uneven portion comprises (i) a plurality of protrusions in contact with the thermoelectric element and (ii) a plurality of recesses in contact with the thermoelectric element.

11. The thermoelectric module according to claim 1, wherein a surface roughness (Ra) of the anchor layer is greater than 3 μm.

12. The thermoelectric module according to claim 1, wherein the anchor layer comprises at least two materials among molybdenum (Mo), nickel (Ni), and titanium (Ti).

13. The thermoelectric module according to claim 1, wherein the thermoelectric element includes at least two compounds among a manganese silicide-based compound (Mn—Si), a magnesium silicide-based compound (Mg—Si—Sn), a skutterudite-based compound (Co—Sb), a half-Heusler-based compound (Zr—Ni—Sn), and a bismuth tellurium-based compound (Bi—Te).

14. The thermoelectric module according to claim 1, wherein the eutectic layer is generated between the stress relieving layer and the electrode by applying a pressure to the stress relieving layer and the electrode in a heated state without the solder material therebetween.

15. The thermoelectric module according to claim 14, wherein the pressure is 1 MPa or more.

16. The thermoelectric module according to claim 1, wherein the stress relieving layer is made of an alloy containing copper and aluminum.

17. The thermoelectric module according to claim 1, wherein the stress relieving layer is made of an alloy containing aluminum and nickel.

* * * * *